(12) United States Patent
Parsonage

(10) Patent No.: US 6,242,891 B1
(45) Date of Patent: Jun. 5, 2001

(54) BATTERY CHARGE INDICATOR

(75) Inventor: Peter Cecil Joseph Parsonage, Auckland (NZ)

(73) Assignee: Batteryguard Limited, Auckland (NZ)

( * ) Notice: Subject to any disclaimer, the term of this patent is extended or adjusted under 35 U.S.C. 154(b) by 0 days.

(21) Appl. No.: 09/486,552

(22) PCT Filed: Aug. 27, 1998

(86) PCT No.: PCT/NZ98/00127

§ 371 Date: Feb. 24, 2000

§ 102(e) Date: Feb. 24, 2000

(87) PCT Pub. No.: WO99/12044

PCT Pub. Date: Mar. 11, 1999

(30) Foreign Application Priority Data

Sep. 1, 1997 (NZ) ........................................... 328655

(51) Int. Cl.[7] .................................................. H02J 7/00
(52) U.S. Cl. .................................................. 320/132
(58) Field of Search ............................................ 320/132

(56) References Cited

U.S. PATENT DOCUMENTS

| | | | |
|---|---|---|---|
| 4,558,281 | * 12/1985 | Codd et al. | 320/136 |
| 4,709,202 | * 11/1987 | Koenck et al. | 320/132 |
| 5,313,152 | * 5/1994 | Wozniak et al. | 320/118 |
| 5,321,627 | * 6/1994 | Reher | 320/DIG. 21 |
| 5,371,682 | * 12/1994 | Levine et al. | 320/136 |
| 5,490,370 | * 2/1996 | McNair et al. | 56/11.9 |
| 5,528,148 | * 6/1996 | Rogers | 320/137 |
| 5,568,052 | * 10/1996 | Sway-Tin et al. | 320/DIG. 21 |
| 5,717,256 | * 2/1998 | Okumura et al. | 307/66 |
| 5,844,325 | * 12/1998 | Waugh et al. | 320/117 |
| 5,929,604 | * 7/1999 | Irvin | 320/136 |

* cited by examiner

*Primary Examiner*—Peter S. Wong
*Assistant Examiner*—Pia Tibbits
(74) *Attorney, Agent, or Firm*—Young Law Firm, P.C.

(57) ABSTRACT

An automotive battery charge indicator uses an algorithm expressed by fixed component values to determine if the remaining charge in the battery has fallen below a predetermined threshold. A current sensing resistor (8) (may be a Hall effect sensor or a discrete component having a resistance of the same order of magnitude as the internal resistance of the monitored battery (1)) is connected in series with the positive terminal (2) of a lead acid battery (1), and the positive side of a non-critical load (4). A percentage of the voltage across the load detected as input (6) is compared by comparator (11) with a dynamic reference voltage at input (5). The dynamic reference voltage is made up of a fixed reference voltage (7) less the voltage drop through current sensing resistor (8). When the percentage of load voltage at (6) is less than the dynamic reference voltage at input (5), the comparator provides a negative output at (12) indicating that the remaining charge in the battery has fallen below the preset threshold value. The output from the comparator can be used to operate an indicator such as an LED, or it could be used to initiate circuit shutdown to protect the battery from being discharged excessively.

10 Claims, 7 Drawing Sheets

BATTERY CHARGE INDICATOR

FIELD OF THE INVENTION

Figure 1:
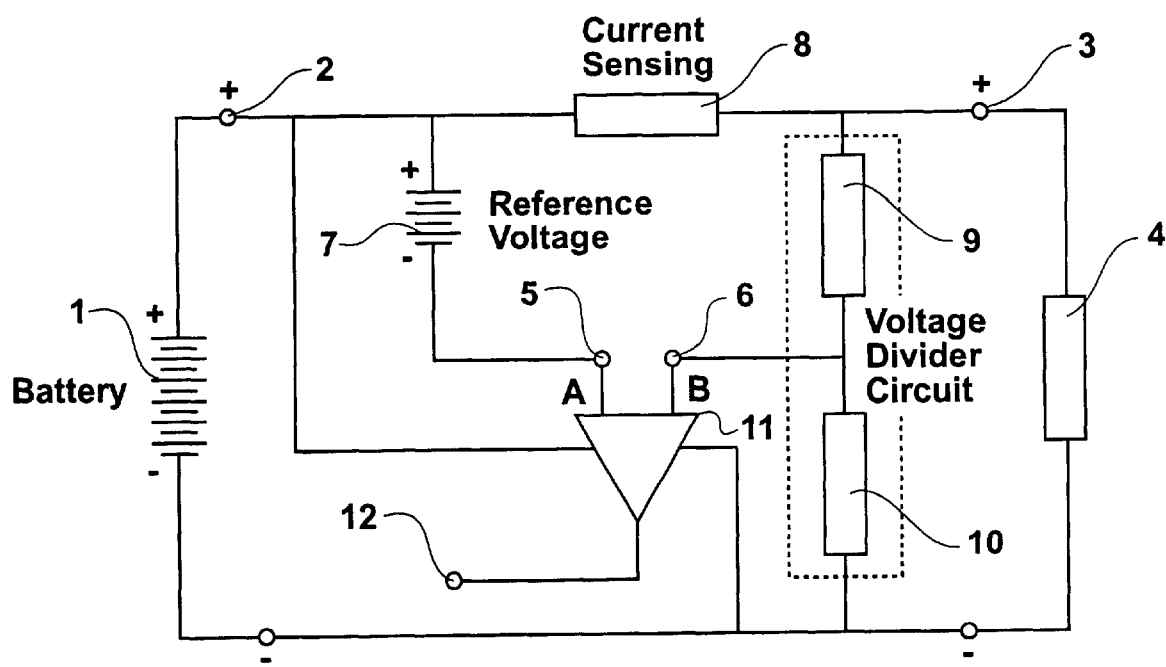

This invention relates to a battery state of charge indicator and has particular application in providing an electrical output signal in the event of the battery charge falling below a preset charge threshold. It is an improvement of our Battery Monitor described in PCT/NZ96/00060 which recommended using a microprocessor to store a look up table of stored values showing the relationship of battery voltage, current, and the state of charge of the battery.

BACKGROUND

Many publications describe means to monitor the residual charge in batteries and in particular automotive batteries, where the amount of charge remaining may determine whether or not the battery can be used at a later time to drive a starter motor and effectively start an engine.

Also, a discharged lead-acid battery will rapidly deteriorate (by a process known as sulphation). There are many other applications of batteries where it is desirable to know the amount of residual charge in the battery, for example batteries used for cell phones, or for emergency equipment. In the case of nickel-cadmium ("nicad") batteries it is desirable to prevent recharging unless the battery is fully discharged or has less than (say) 10% of maximum charge.

Although modern motor vehicle batteries have progressively improved in capacity there remains a risk that the battery can be accidentally discharged, for example, by leaving the lights on when leaving the vehicle or in other similar ways. Thus the driver on returning to the vehicle will not be able to start the engine because insufficient voltage or capacity remains in the battery to turn the starter motor or to provide sufficient power to the spark plugs, for example, to provide a useable spark. This can of course extremely inconvenient for the driver. In some situations, for example, in extreme weather conditions or in localities offering high personal risk a flat battery can be actually dangerous.

Some attempts have been made to overcome this problem, for example, by providing what are in effect double batteries or pairs of batteries but such arrangements may not solve the problem in all circumstances as an opportunity for the starting battery or for the vehicle starting cells to go flat, still remains.

Paredes (U.S. Pat. No. 4,020,414) is one of many inventions that uses battery voltage during discharge as a gauge of capacity, to warn the user of potential failure. These are in effect narrow-range voltmeters for the 11–12 V range, and assume use with a 12 V battery. Paredes uses an array of lamps as a voltage display. Paredes teaches (as in his FIG. 3) that there is a gradual decline of cell voltage as the level of charge is reduced. Stevens (U.S. Pat. No. 4,028,616) includes with his voltmeter a method for measuring voltage under no load and then after a ten-second engine start routine, in order to assess battery condition.

During research for this invention and that of my earlier PCT/NZ96/00060, the problem of relying solely on voltage as per the above prior art was realised. It gives too inaccurate a cutoff point.

Sheldrake (U.S. Pat. No. 4,493,001) teaches a motor battery rundown protection system which does include disconnection and reconnection means but this system has only voltage sensing means. The same can be said for Sloan (U.S. Pat. Nos. 4,902,956 and 5,332,958).

There exist many methods for determining the remaining charge in a battery but their complexity makes them potentially unreliable and too expensive to achieve universal acceptability.

The use of a microprocessor to store a look up table as described in our earlier PCT/NZ96/00060 results in an effective but expensive solution which is suited to some applications, e.g. monitoring truck batteries, or the batteries used on heavy machinery. There is a need for a less expensive solution.

Definitions

"A critical load" is a term used to refer to an important use of battery charge, such as for turning over an internal-combustion engine as part of an engine starting process.

"A non-critical load" is a term used to refer to a less important and possibly inadvertent use of battery charge, such as for running headlights, parking lights, or a radio.

"A defined type of battery" refers to a set of batteries having substantially similar voltage/current/state-of-charge characteristics, and for example refers in general to the class of conventional lead-acid storage batteries as are used in petrol or diesel-driven cars and similar road vehicles. (Some individual products may differ in characteristics from the majority; perhaps due to different details of design). Sealed, gel-electrolyte lead-acid storage batteries may comprise a different set of known battery types and nickel-cadmium rechargeable batteries are likely to comprise a different set.

Object

The object of this invention is to provide an improved method for determining whether or not the remaining charge in a battery has fallen below some predetermined threshold.

Statement of Invention

In one aspect the invention provides a battery charge monitoring means for deriving an indication of the state of charge of a defined type of battery, the monitoring means having:

means capable of sensing a load voltage proportional to current flowing when a defined type of battery is connected to a load, a fixed reference voltage which is less than the maximum voltage of the defined type of battery to which the monitoring means is to be connected, current sensing means capable of providing a voltage output equivalent to the voltage drop within the defined type of battery when under load as a result of the internal resistance of the defined type of battery, means capable of sensing a dynamic reference voltage comprising the fixed reference voltage minus the voltage output of the current sensing means, comparison means capable of comparing (a) the load voltage and (b) the dynamic reference voltage to provide an output indicative of the state of charge of the battery, Preferably the means is connected to evaluation means capable of determining the state of charge of the battery based on an output from the comparison means.

Preferably the comparison means comprises a comparator.

Preferably the current sensing means comprises a current sensing resistor having a resistance of the same order of magnitude as the internal resistance of the defined type of battery to which the monitoring means is to be connected.

Preferably the current sensing means comprises a Hall effect sensor.

Preferably the fixed reference voltage for a 12 volt 40 ampere-hour lead acid battery is about 25 volts.

Preferably the monitoring means is connected to an automotive battery between a non-critical load and one of the battery terminals and includes at least one switching means in series with the non-critical load capable of connecting or disconnecting the non-critical load from the automotive battery, the switching means being controlled by an output from the comparison means.

Preferably the evaluation means comprises a microprocessor connected to the output from the comparison means, said microprocessor being capable of controlling the switching means.

Preferably the microprocessor is capable of controlling in use a visual display means to signal if the battery state of charge is above or below a predetermined threshold value.

Preferably the monitoring means includes means for sensing a change in the non-critical load to cause the microprocessor to control the switching means to reconnect the non-critical load to the battery when the microprocessor receives a signal that a change in the non-critical load has been detected.

DRAWINGS

These and other aspects of this invention, which should be considered in all its novel aspects, will become apparent from the following description, which is given by way of example only, with reference to the accompanying drawings, in which:

FIG. 1: is a schematic circuit diagram of a first form of the battery state of charge indicator.

Figure 2:
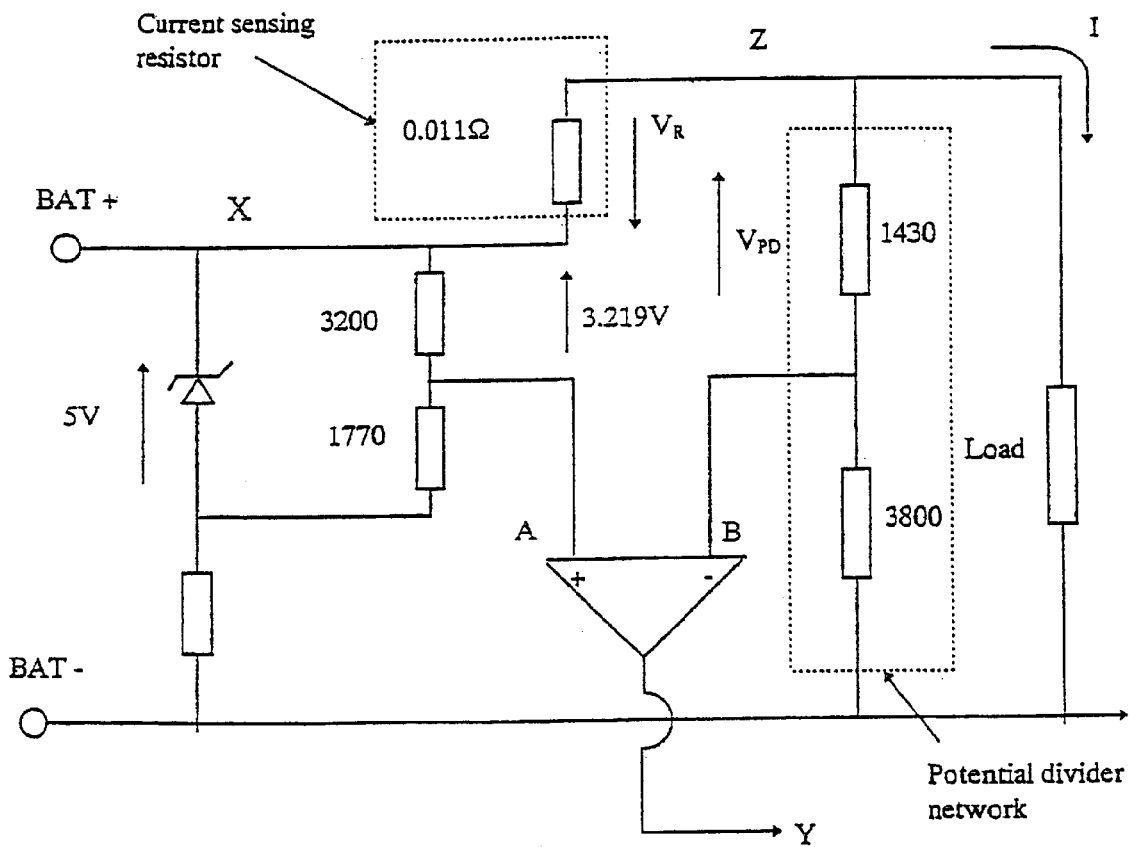

FIG. 2: illustrates an alternative way of analysing the circuit of FIG. 1.

Figure 3A:
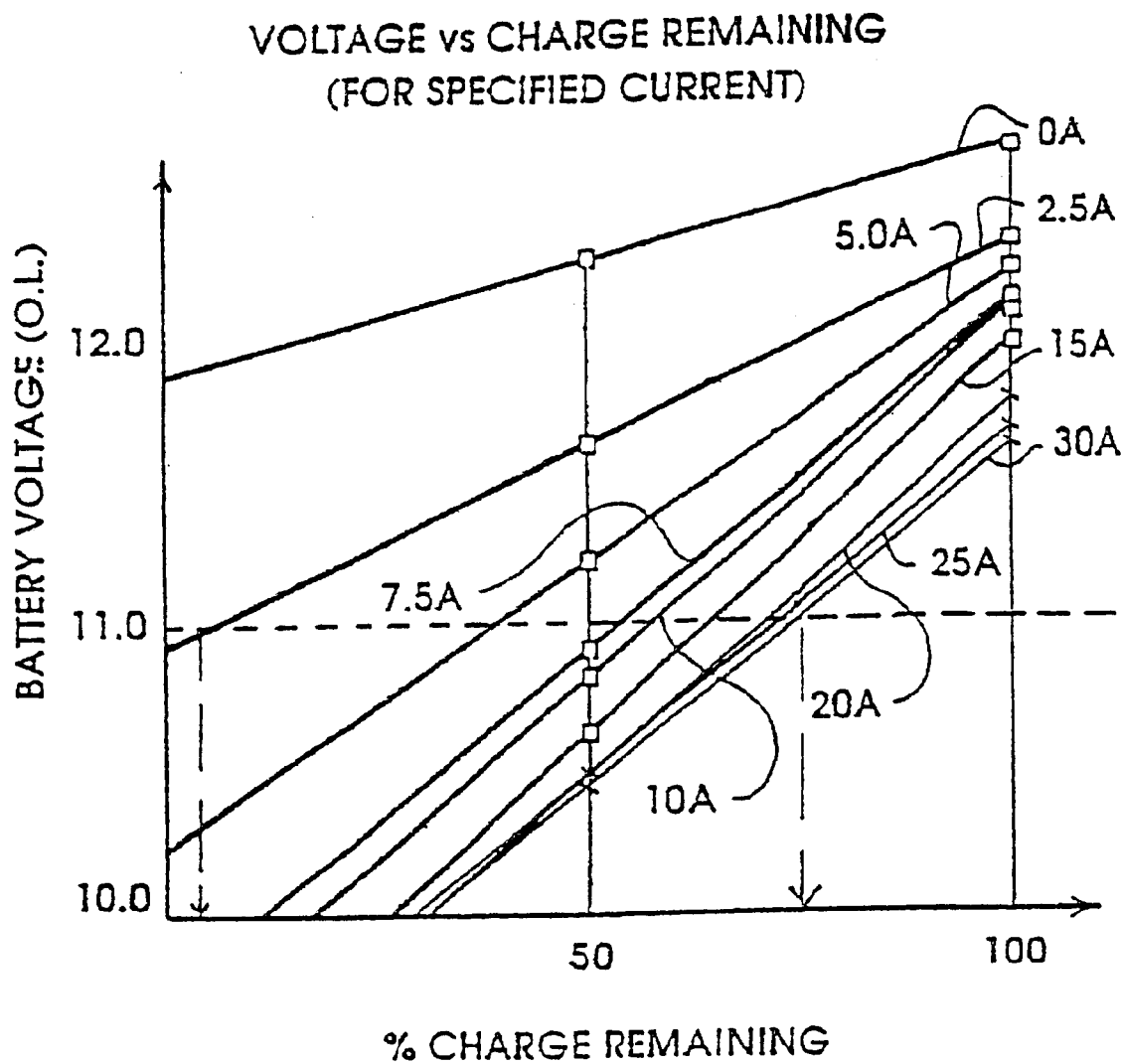

FIG. 3A: is a graph of battery voltage versus percentage (%) charge remaining (Amp-hours used) for a lead-acid battery.

Figure 3B:
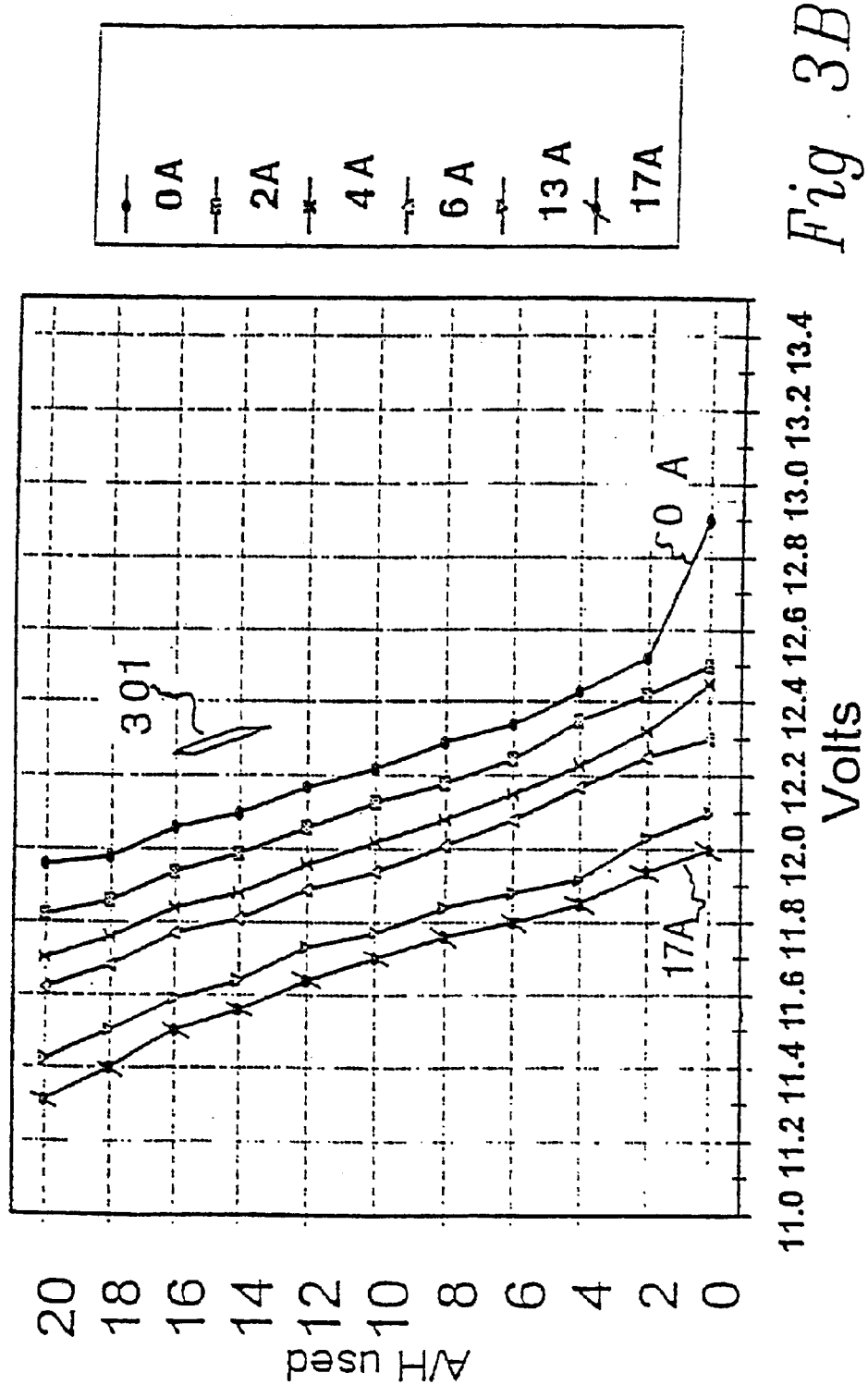

FIG. 3B: is a second graph of battery voltage versus percentage (%) charge remaining for a lead-acid battery.

Figure 3C:
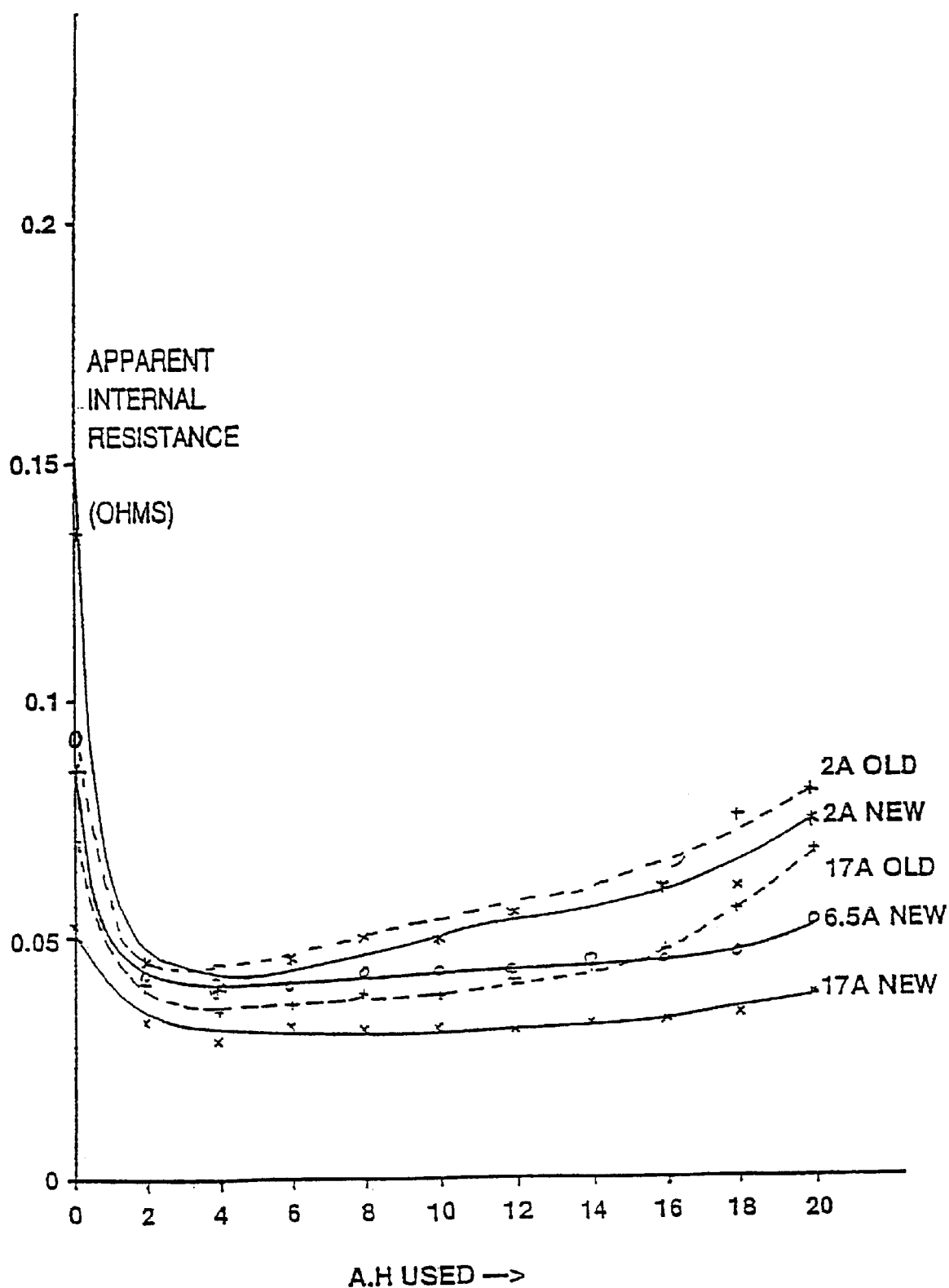

FIG. 3C: is a graph of internal resistance versus percentage (%) charge remaining.

Figure 4:
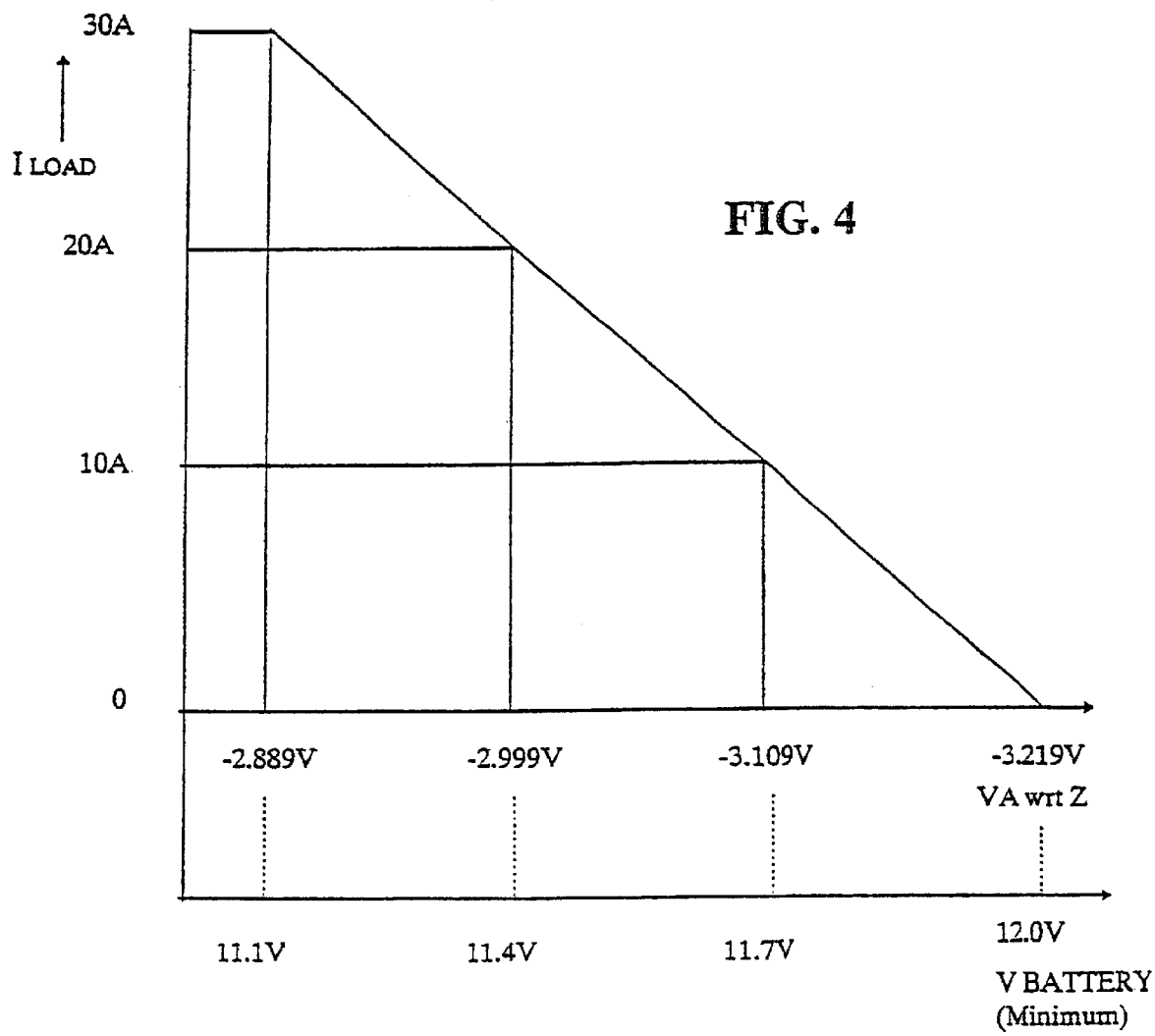

FIG. 4: is a graph of load current against battery voltage, for nominal 50% state of charge of a lead acid battery.

Figure 5:
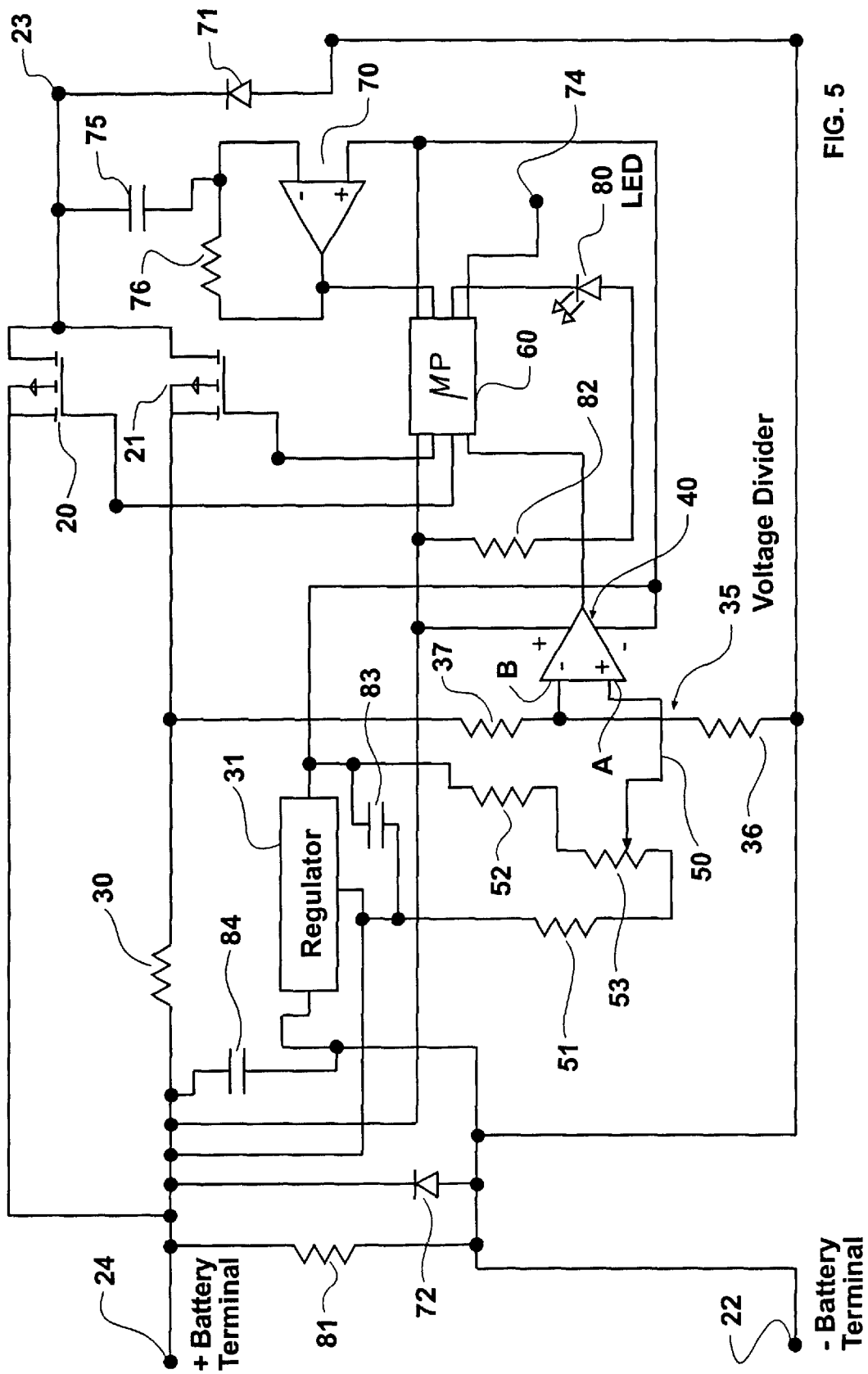

FIG. 5: is a preferred circuit for sensing the state of charge and if necessary disconnecting non-critical loads.

INTRODUCTION

A preferred form of the device has as one function that of conserving charge in a battery so that a critical application is still capable of being carried out at a later time; possibly at the expense of non-critical use. The battery is isolated by a series switch if the battery charge drops below a predetermined level (such as half-full, or 20 Ampere-hours ("Ah") remaining in the battery). A specific example of a critical application is to leave enough Ampere-hours so that a car engine can still be started, under conditions such as possibly inadvertent steady drain by various accessories such as lights; for a battery of some indeterminate age and hence total capacity. I prefer to retain a charge of about 20 Ah for starting the car. Because batteries have a finite and rather short life of typically two to five years, during which time the capacity drops, I prefer to be conservative in relation to the size of the retained charge.

A preferred form of the device is intended to automatically reconnect the battery and restore normal electrical power as soon as it senses that a critical demand is imminent, such as when a person returns to his or her car and operates the ignition/starter switch. The series switch is preferably placed in series with the lighting, charging, and accessories circuit from the battery, not in series with the starter motor itself. (Note that improvements in solid-state switches, by providing sufficient capacity at a reasonable price, do allow the invention to also be wired in series with the starter motor).

Several properties of batteries; whether rechargeable storage batteries (secondary cells) or primary cells can be measured electrically. These include the cell voltage under loads ranging from zero to a high level, and calculations can provide further data such as internal resistance.

That the cell voltage drops gradually during discharge is known (see Paredes, cited above). This is likely to be a function of the concentration of sulphuric acid which is the electrolyte in the vicinity of the plates, and the chemical composition of the plates, and the degree of sulphation. I have found that reliance on cell voltage alone—as described in the prior art—is insufficiently accurate for the ultimate goal of conserving a known amount of charge within a battery, because other factors, principally the rate of current drain, also have an effect. This is described in my earlier PCT applications PCT/NZ96/00060. I discovered that taling into account, other factors such as those dependent on load current, allows an improved prediction of the state of charge of the battery over simply measuring the voltage across the battery terminals as is done in the prior art.

Thus preferred forms of this device includes means to measure battery voltage during a load, and to compare it to a dynamic reference voltage which compensates for the internal resistance of the battery.

Refer to FIG. 3A. The majority of prior-art battery charge conservers sense a voltage only as an indication of charge. Suppose 11.0 V was used as the criterion (for a 12 V battery) then according to this graph, a battery delivering 2.5 A at the time would be isolated for conservation when practically empty, while a battery delivering 30 A at the time of measurement would be isolated for conservation at about 75% fully charged. In FIG. 3B—a different set of measurements—if 12.0 V was used as the criterion then according to this graph, a battery delivering zero amperes at the time of measurement would be isolated for conservation when 20 Ah has been used (any anything from 0 to 20 Ah is left, depending on the age of the battery), while a battery delivering 17A at the time of measurement would be isolated for conservation immediately—at its fully charged state.

The preferred forms of the invention take into account both voltage and current and the internal resistance of the battery and thereby allow much more precise determination of the point at which the battery is disconnected. The preferred resolution is to the nearest 0.1 V and the nearest 0.1 A The box labelled 301 in FIG. 3B is greater than the resolution inherent in the preferred embodiment of this. invention).

I have found that the apparent internal resistance of a lead-acid battery is non-linear; it is not a simple ohmic resistance. It is reduced as the current drawn goes up; so that for a typical car battery it is about half the minimal value when about 15 A load is applied. FIG. 3C depicts this effect; showing apparent internal resistance in relation to charge used and battery age. Ohms are shown on the vertical axis, and charge used is along the horizontal axis. For the new battery, about 20 Ah remains at the end of the trial but an uncertain smaller amount remains for the old battery (otherwise in GOOD condition). Points were calculated as usual, using the voltage difference between no load and a set load, divided by current.

In order to derive the data, a 45 Ah battery was fully charged, then discharged at 4 A; while at constant intervals measurements were taken at a range of currents. It appears that in this case at least the internal resistance itself does not offer a particularly useful indicator of the remaining charge, because the internal resistance is not greatly affected by the state of-charge within the middle of the range. In the fully charged state at the left side, surface effects predominate.

The nonlinearity of internal resistance results in the family of "curves" or voltage v charge plots shown in FIG. 3A or in FIG. 3B tending to lie closer together at higher current drains.

FIG. 4 shows the load current against battery voltage for a 50% state of charge, showing how the dynamic reference voltage detected at input A of the comparator of FIG. 2, can be used as a measure of battery terminal voltage when under load.

First Embodiment—FIG. 1

Some types of battery, for example the lead-acid batteries commonly used in automobiles, are permanently damaged if discharged excessively. There is a need for a simple circuit to identify when such a battery is discharged below 50% or some other S predetermined percentage charge. In the following description, reference will be made to a nominal 50% state-of-charge as the designer may choose to set the unit-off point to suit the size of the battery and the demands placed on the battery. Typically the cut-off point will be between 40% and 60% of full charge. This embodiment satisfies that requirement and uses very few components.

As a battery is discharged two things happen: its equivalent Thevenin Equivalent Circuit) internal resistance increases, and it's equivalent series connected source of electromotive force (E.M.F.) decreases. Existing methods for measuring the state of charge of a battery typically operate by assuming a known current to be flowing from the battery and then estimate the remaining charge by measuring only the terminal voltage. Some methods do utilise complex circuitry to measure both the terminal voltage and the current flowing in the external circuit, then relate the two using a predetermined algorithm.

This embodiment uses a new arrangement of very few components to both measure and combine voltages proportional to the current flowing and to the terminal voltage in order to produce an electrical signal indicating when the remaining charge in the battery has fallen below some predetermined threshold value, say nominal 50% for a lead-acid battery (but perhaps nominal 10% for a nicad battery). By choosing the component values in accordance with a particular algorithm, a comparator can be used to indicate if the state-of-charge is above or below a pre-set threshold value, eg. nominal 50% of full charge.

This embodiment is illustrated in FIG. 1, with components arranged as follows.

Current sensing means 8 provides compensation for the internal resistance of the battery when under load, by providing a voltage which forms part of a dynamic reference voltage. This current sensing means may be a Hall effect sensor represented by box 8, but in the following examples it will be descnied as a current sensing resistor 8 which may be a discrete component (ie a fixed value resistor 8) or because of its small value it may be part of a lead connecting the load 4 to the battery terminal 2.

A current sensing resistor 8, chosen to suit the range of currents likely to be encountered, is connected in series with the positive battery terminal 2 and the positive side of the load 3. Typically the resistance of Resistor 8 is of the same order of magnitude as the internal resistance of the battery 1 with which it will be used, eg. from 3 milli-ohms to 300 milli-ohms for a 12 volt lead acid automotive battery.

A potential divider comprising two resistors, 9 and 10, is connected across the load 4 so that a predetermined percentage of the voltage across the load 4 is provided at input 6 of the comparator 11. This percentage of load voltage at input 6 is compared with the dynamic reference voltage at input 5. Both these input voltages at points 5 and 6 are relative to the positive battery terminal 2. When the total measured voltage 6 is less than the dynamic reference voltage 5, the comparator provides a zero output 12 (relative to the positive battery terminal 2) indicating that the remaining charge in the battery has fallen below the preset threshold value which was used to calculate both the reference voltage 7 and the required ratio for the potential divider circuit. The output from the comparator could be used to operate indicating lights or it could be used to initiate circuit shutdown to protect the battery from being discharged excessively.

The dynamic reference voltage at input 5 comprises the fixed reference voltage 7 less the voltage drop across resistor 8 when the battery is under load. Voltage source 7 could be supplied by a small battery but it is more convenient to use the standard 5 volt regulator and a voltage divider to generate the calculated reference voltage 7.

EXAMPLE 1

The necessary calculations are as shown below:

Define

B=battery voltage with the load connected

R=resistance of the current sensing resistor use R=0.008 ohms in this example

I=current flowing from the battery, through the current-sensing resistor and through the series connected load

| | |
|---|---|
| k | = ratio for potential divider resistors |
| | = (resistor 9)/([resistor 9] + [resistor 10]) |

V=reference voltage

By means of measurements taken on very many 12 volt 40 ampere-hour car batteries, each previously discharged to 50% capacity, it can be shown empirically that:

For I=20 Amperes, B=11.3 volts and for I=5 Amperes, B=11.75 volts, as can be seen from the attached graphs.

For zero output from comparator, (ie. output midway between positive and negative)

$V = I \times R + k \times (B - (I \times R))$

Substitute chosen value for R, 0.008 ohms in this example $V = 0.008 \times I + k \times (B - (0.008 \times I))$ Substitute first set of values for I, B $V = 0.008 \times 20 + k \times (11.3 - (0.008 \times 20))$ $V = 0.16 + k \times 11.14$ \hfill (1)

Substitute second set of values for I, B $V = 0.008 \times 5 + k \times (11.75 - (0.008 \times 5))$ $V = 0.04 + k \times 11.71$ \hfill (2)

Equation (1)—Equation (2)

$0 = 0.12 - k \times 0.57$ $k = 0.2105$

This value for k can be satisfied if:

Resistor 9=1040 ohms, and resistor 10=3900 ohms

Use value for k in Equation (1) to find value for V $$V=0.16+(0.2105\times11.14)$$

$$V=2.505 \text{ volts}$$

The calculation example shown above is for a 50% threshold. Using a different pair of empirically determined voltage/current values could give any desired threshold percentage.

FIG. 2

An alternative way to analyse the same circuit is discussed below, with reference to FIG. 2. This method of analysis is presented because it illustrates the manner in which the reference voltage varies according to the current drawn by the load.

In FIG. 2, the reference point for voltages at the OP-Amp inputs A, B is point X. The reason being that it is the positive terminal of the battery and circuit testing is simplified for technicians not fully aware of circuit operation.

In the original design calculations the reference point was at point Z, so that the voltage developed across the current sensing resistor is subtracted from the reference voltage in such a way as to compensate for the fall in battery terminal voltage caused by the load current flowing through the battery's (Thevenin Equivalent) internal resistance.

Analysis with Z as reference.

$$V_A = -3.219 \text{ v} + V_R$$

$$V_B = -V_{PD}$$

So long as $V_A > V_B$ the output of the $O_p$-Amp, Y, is positive (approximately equal to zero volts compared to point Z or point X).

EXAMPLE 2

I=30 A, $$V_{BAT}=11.15 \text{ v}$$

$$V_A = -3.219 + 30 \text{ A} \times 0.011 \text{ }\Omega$$

$$\boxed{V_A = -2.889 \text{ v}}$$

$$V_B = -V_{PD} = 1430 \times -\{11.15-(0.011\times30)\}$$

1430+3900

1430×{-(11.15-0.33)}

5330

$$\boxed{V_B = -2.903 \text{ v}^5}$$

Hence $V_A > V_B$ ie. more positive

Hence Y has an output of about zero volts when compared with reference points Z or X.

Battery Is Good

EXAMPLE 3

$$\boxed{V_A = -2.889 \text{ v}}$$

Note how this, the reference voltage takes into account the current flow reducing below the 3.22 v to accommodate voltage drop in the battery due to internal resistance.

$$V_B = -V_{PD} = \frac{1430}{1430+3900} \times [-(11.05 \text{ v} - (0.011 \times 30))] \therefore V_B = -2.876 \text{ v}$$

Battery Is Bad

Switch Off Point

With the circuit's critical elements configured as shown the battery is being considered as BAD when:

Cell EMF<2.000 v and

Cell Internal Resistance>5 mΩ

$$\left(5m\Omega = \frac{1}{6} \times \frac{0.9 \text{ v}}{30A}\right)$$

Note that this internal resistance includes allowance for intercell connections, connection to battery terminals, lead resistance etc.

This is the case of a nominal 50% charge remaining point. Numerous tests on various vehicles indicate it to be a useful value, and it is illustrated in the graph of FIG. 4, showing voltages from a no load condition through to 30 Amps load current.

FIG. 5 shows one example of a circuit for an automotive battery which circuit makes use of a pair of Field Effect Transistors ("FETs") to switch off the accessories. FET 20 is a bypass FET used to shut current away from the measurement circuit to minimise power dissipation and excessive heat. FET 20 is turned off by the microprocessor while measurements are being performed. Both FET 20 and FET 21 are turned off to disconnect the load.

In this arrangement a 40 Amp Hour automotive battery can be connected to the device which is connected between the vehicle accessories (the non-critical load) and the positive terminal of the battery.

A pair of FETs 20 and 21 are connected between the accessories 23 and the positive battery terminal 24. In this example a 5 watt resistor 30 of 0.008 ohms is chosen as the resistor value of the same order of magnitude as the internal resistance of the 40 amp hour battery.

A 5 v regulator 31 is connected across the battery terminals 22, 23 and its output is divided by a voltage divider 35 comprising resistors 36 and 37.

Resistor 36 has a resistance of 3900 ohms and resistor 37 has a resistance of 1040 ohms as calculated in example 1. This sets the input level B at comparator 40 as 2.505 volts at 50% switch-off point current/voltage.

The positive input A of comparator 40 (LM358) is supplied from voltage divider 50 comprising two 2,200 ohm resistors 51, 52. A variable resistor 53 is provided between resistors 51 and 52 to enable the voltage divider to be adjusted to the required level so that the output from comparator 40 can be recognised by microprocessor 60, and used to signal the state of charge of the battery.

Microprocessor 60 controls the gates of FETs 20, to switch them on or off, dependent upon the output from comparator 40, or if a measurement is being made when just FET 20 is turned off.

Op-amp 70 is used to reconnect the accessories to the battery, when it senses a change in the load connected to terminal 23.

A 0.47 microFarad capacitor 75 is connected between terminal 23 and the negative input of Op-amp 70. The non-inverting input of Op-amp 70 is at circuit ground potential. A 1 mega-ohm resistor 76 is connected between the capacitor 75 and the output from Op-amp 70.

A 1 kilo-ohm resistor 81 is connected between battery terminals 22, 24. A 1 kilo-ohm resistor 82 is connected to the LED 80.

A 1 microFarad capacitor 83 is connected between resistors 51, 52, and a 10 microFarad capacitor 84 is connected between battery terminal 24 and the 5 volt regulator 31.

Microprocessor 60 also controls the frequency of a light emitting diode 80. A timer within microprocessor 60 is set to cause the LED to flash at 60 beats per minute if the device senses that the automotive battery is GOOD, but in the event of disconnecting the accessories or otherwise sensing that the battery is BAD, ie. the state of charge is dropped below the predetermined cut-off point, then the timer will cause the LED to flash at a faster rate of 120 beats per minute, and in the event of the complete failure of the battery, the LED will no longer be lit.

The operation of this circuit essentially models the operation of the circuit described with reference to FIGS. 1 and 2. Thus if the voltage detected at input A of comparator 40 is greater than the voltage detected at input B of comparator 40, than the output of comparator 40 will be approximately equal to 0 volts, and the input to microprocessor 60 will be such that the microprocessor will record the battery as GOOD and will keep open the gates of the FETs 20, 21 such that the accessories 23 may continue to draw current from the battery.

If however the lights are left on, and the vehicle is unattended, or some other non-critical load remains connected to terminal 23 the current will be drawn from the battery through the non-critical load. During this time the device will regularly turn off FET 20 and monitor the stage of charge of the battery.

If the stage of charge of the battery drops below the predetermined threshold, which I have described as a nominal 50% of the stage of charge, leaving the battery with perhaps 20 amp hours remaining, then the device of FIG. 5 will sense that the voltage at terminal A of comparator 40 is less than the voltage at terminal B of comparator 40 and hence the output will be approximately equal to minus 5 volts with respect to the positive terminal 24, and this negative output from comparator 40 leading to the input to the microprocessor 60 will cause the microprocessor to record the battery status BAD, and will cause FETs 20 and 21 to be switched off by disconnecting all of the non-critical load (eg. lights or other items connected to terminal 23) from the positive battery terminal 24.

With the vehicle unattended the battery's stage of charge will then be conserved at the nominal 50% stage of charge, as the non-critical loads are disconnected from the battery.

Battery terminal 24 is connected directly to the starter motor in the usual way. However, in a normal vehicle, the ignition switch would be normally be regarded as a non-critical load and in this case it would be connected to terminal 23 of the device. Similarly the key controlled starter motor switch (but not the starter motor relay) would be connected to terminal 23.

Without some means of reconnecting the non-critical loads, a driver returning to the vehicle and endeavouring to switch on the ignition and the starter motor would find that the vehicle failed to respond to the ignition key.

Whilst it is possible that the ignition key could be connected as a critical load across battery terminal 24, this is not preferred.

Instead I prefer to have the ignition and starter motor switches connected to terminal 23 forming part of the non-critical load, and then providing means for reconnecting the non-critical load at the appropriate time.

Op-amp 70 (LM358) and its associated circuitry is designed to achieve this, by sensing a change in the non-critical load. For example if the vehicle door is opened, and the courtesy light switches on, this will change the amount of the load connected to terminal 23. This change in the non-critical load is detected by Op-amp 70 so that the output of Op-amp 70 causes the microprocessor 60 to switch on the FETs 20 and 21. To prevent the microprocessor from switching them off again as soon as comparator 40 senses that the battery is BAD, microprocessor 60 can include a counter which counts the number of pulses before the microprocessor is allowed to switch off the FETs 20, 21. Typically the counter may be set to count for 2 minutes before switching of the FETs.

Leakage across FETs 20, 21 and their drain-source capacitance is sufficient to enable Op-amp 70 to operate. If another switching means is used in place of FETs, for example relays, it may be desirable to use a leakage resistor across the switching means to provide just enough voltage for the Op-amp 70 to operate. Diodes 71, 72 are optional but provide protection against electrical spikes which might otherwise damage an onboard computer. Terminal 74 is a spare input/output from the microprocessor 12c508.

In this circuit optional switch 20 (FEI) acts to bypass the device. The enables the switching on of the FETs when the non-critical load changes, and at the same time minimises overheating of the device, by allowing the timer in microprocessor 60 to cause the device to sample the battery for a very brief duration in any given time interval. For example the timer within microprocessor 60 may be set to cause the device to sample the battery state of charge for say 10 milliseconds every second, or some other time interval suited to checking on the battery, whilst minimising the amount of time that the device is operating.

Variations

Comparing this device with different vehicles suggests that in some cases the non-critical load will be reconnected allowing the vehicle to be started whether or not the lights or some other major non-critical load have been left on. In other cases connection of the non-critical load will not occur and the vehicle will not start until the non-critical load has been turned off by the driver. For example the driver may then recognise that the lights have been left on and the device had cut off the non-critical load. If the driver then switches off the lights, the device would allow all of the non-critical load to be reconnected so that the ignition switch and starter motor switch can now be operated, thereby allowing the vehicle to be started as sufficient charge would remain in the battery to power the starter motor.

Heavy duty versions of the circuit may be produced, in which case may be desirable that heavy duty relays be used in place of FETs. Some cars, and most trucks may require considerably more current than the 30 amps required for most vehicle accessories, in which case relays may be preferred over FEIs.

The above examples have been developed with a 12 V lead-acid storage battery in a vehicle (such as a car, plane, or boat) as the most likely application. In such a case the current sensing resistor could be provided by part of the cable connecting the device to the non-critical load.

The device does not have to be in series with the positive terminal. In fact it would be a lot easier to have it in series with the positive terminal. In fact it would be a lot easier to have it in series with the negative terminal. It is only for cars with negative earth, and that is almost every car nowadays, that we need it in series with the positive terminal. If it was built into a cellphone battery I would prefer to design it in series with the negative terminal.

The method has yet to be evaluated with other existing and to-be-developed types of battery, such as nickel-cadmium batteries, metal hydride batteries, or other formulations of lead acid batteries. Metal hydride batteries have no memory problem unlike nickel-cadmium batteries and for example are used in cell phones. Most types of battery exhibit (as well as changes in output voltage) changes in effective internal resistance during discharge, like those of lead-acid batteries, although the magnitude, and linearity of changes may be a function of the types of battery.

The circuit may be designed with identified threshold-adjusting components (such as those around the measuring points) so that it can be adapted for batteries having other numbers of cells and hence different voltage or current ranges with minimal redesign. If the device is to be used on batteries having less than about 6 volts output when low, it may be useful to raise this voltage to 7 or 8 volts for the circuits own power supply, because presently available devices generally prefer a 5 V (or a 3.3 V) regulated supply.

The circuit may be adapted to serve during charging of a battery, perhaps as an alternator control and/or a voltage regulator.

For example, determination that only a small charge remains may cause the initiation of an automatic charging process such as the unfurling of blades of a wind-driven generator or exposure of a solar panel to the sun. This feature is potentially useful in hybrid electric vehicles which employ batteries to operate electric propulsion motors and a battery charging generator powered by an internal combustion engine.

Current could also be determined by the brightness of a lamp filament, or the temperature of a resistive element, or the EMF of an electrochemical cell, etc.

The device as described could also be incorporated in a device designed for operation by a vehicle battery to prevent that particular device excessively discharging the battery—for example a portable refrigerator used to keep drinks cool in a car or boat and powered from the car's (or boat's) battery.

Advantages

None of the prior art appears to teach a procedure for accurately assessing battery charge condition and actually disconnecting a battery from a load in order to conserve at least some charge for a critical application, and automatically reconnecting The circuits of this invention are able to use a novel arrangement of very few components to sense the state-of-charge of a battery and indicate when it has fallen below a preset threshold value. It is particularly suited to the design and manufacture of battery indicators for automotive batteries and may be used with a circuit to switch off non-critical loads (such as lights, indicators, or a radio, which have been left on when the engine is switched off).

a) The circuit's operation does not rely on a microprocessor, or any logic circuitry at all. Addition/subtraction are achieved by analogue means. Optionally a microprocessor could be used as an optional feature to control the display, as shown in FIG. 5.

b) The circuit operation is independent of the Op-Amp gain, it only amplifies the "bridge" differential in order to switch the FETs.

c) The FETs are used as switches, I could have used other types of solid-state switches, or a relay or motor driven switch etc.

Finally, it will be appreciated that various alterations and modifications may be made to the foregoing without departing from the scope of this invention as set forth in the claims.

What is claimed is:

1. A battery charge monitoring means for deriving an indication of the state of charge of a defined type of battery, the monitoring means having:

means for sensing a load voltage proportional to current flowing when a defined type of battery is connected to a load, a fixed reference voltage which is less than the maximum voltage of the defined type of battery to which the monitoring means is to be connected, current sensing means capable of providing a voltage output proportional to the voltage drop within the defined type of battery when under load as a result of the internal resistance of the defined type of battery, means for sensing a dynamic reference voltage comprising the fixed reference voltage minus the voltage output of the current sensing means, comparison means capable of comparing (a) the load voltage and (b) the dynamic reference voltage, to provide an output indicative of the state of charge of the battery.

2. A battery charge monitoring means as claimed in claim 1, wherein the comparison means is connected to evaluation means capable of determining the state of charge of the battery based on an output from the voltage comparison means.

3. A battery charge monitoring means as claimed in claim 1, wherein the comparison means comprises a comparator.

4. A battery charge monitoring means as claimed in claim 1, wherein the current sensing means comprises a current sensing resistor having a resistance of the same order of magnitude as the internal resistance of the defined type of battery to which the monitoring means is to be connected.

5. A battery charge monitoring means as claimed in claim 1, wherein the current sensing means comprises a Hall effect sensor.

6. A battery charge monitoring means as claimed in claim 1, wherein the fixed reference voltage for a 12 volt 40 ampere-hour lead acid battery is about 2.5 volts.

7. Battery monitoring means as claimed in claim 1, wherein the monitoring means is connected to an automotive battery between a non-critical load and one of the battery terminals and includes at least one switching means in series with the non-critical load capable of connecting or disconnecting the non-critical load from the automotive battery, the switching means being controlled by an output from the comparison means.

8. Battery monitoring means as claimed in claim 7, wherein the evaluation means comprises a microprocessor connected to the output from the comparison means, said microprocessor being capable of controlling the switching means.

9. Battery monitoring means as claimed in claim 8, wherein the microprocessor is capable in use of controlling a visual display means to signal if the battery state of charge is above or below a predetermined threshold value.

10. Battery monitoring means as claimed in claim 7, wherein the monitoring means includes means capable of sensing a change in the non-critical load and causing the microprocessor to control the switching means to reconnect the non-critical load to the battery when the microprocessor receives a signal that a change in the non-critical load has been detected.

* * * * *